United States Patent
Takemura

[11] Patent Number: 6,033,973
[45] Date of Patent: *Mar. 7, 2000

[54] ION DOPING DEVICE AND METHOD OF CLEANING ION DOPING SYSTEM

[75] Inventor: Yasuhiko Takemura, Kanagawa, Japan

[73] Assignee: Semiconductor Energy Laboratory Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/567,279

[22] Filed: Dec. 5, 1995

[30] Foreign Application Priority Data

Dec. 6, 1994 [JP] Japan .................................. 6-330181

[51] Int. Cl.[7] .................................................. H01L 21/00
[52] U.S. Cl. ........................... 438/514; 438/905; 134/1.2; 134/42; 216/58; 216/67; 118/715; 118/716; 118/723 R
[58] Field of Search ....................... 134/42, 1.2; 118/715, 118/716, 723 R; 438/905, 514; 216/58, 67

[56] References Cited

U.S. PATENT DOCUMENTS

| 4,498,953 | 2/1985 | Cook et al. | 156/646 |
| 5,563,095 | 10/1996 | Frey | 437/141 |

FOREIGN PATENT DOCUMENTS 07273088 10/1995 Japan .

Primary Examiner—Michael P. Woodward
Assistant Examiner—C. Delacrois-Muirheid
Attorney, Agent, or Firm—Sixbey, Friedman, Leedom & Ferguson, PC; Jeffrey L. Costellia

[57] ABSTRACT

A halogen fluoride such as $ClF_3$ is introduced into the chamber of the doping system. During the doping process, boron adhering to the inner wall of the chamber is changed into gaseous boron fluoride (such as $BF_3$) and driven off.

19 Claims, 3 Drawing Sheets

ION DOPING DEVICE AND METHOD OF CLEANING ION DOPING SYSTEM

BACKGROUND OF THE INVENTION

1. Field of the Invention

The present invention relates to a method of cleaning a doping system which is used during fabrication of semiconductor integrated circuits or the like.

2. Prior Art Techniques

When n-type or p-type doped regions are formed in a semiconductor during fabrication of a semiconductor integrated circuit or the like, it is known to accelerate ions of impurities of the n- or p-type at a high voltage, for implanting the impurities into the semiconductor. Especially, the method of separating ions in terms of mass-to-charge ratio is known as the ion implantation and has enjoyed wide acceptance in semiconductor integrated circuit fabrication processes.

Another known method consists of generating a plasma having an n- or p-type impurity and accelerating the ions contained in the plasma at a high voltage so as to introduce the ions into a semiconductor. This method is known as the ion doping or plasma doping.

For example, where boron is implanted as a p-type impurity, a plasma is generated by RF discharge or other method within a gas such as diborane ($B_2H_6$) which is a boronic compound. Then, a high voltage is applied across the plasma. The ions having boron are extracted and lodged into a semiconductor.

Generally, the former method needs complex and expensive equipment and is capable of processing only substrates having small areas. On the other hand, the latter method requires only simple and inexpensive equipment and is able to process large-area substrates. Therefore, it is considered that the latter method is used for manufacture of active matrix liquid crystal displays having large-area substrates to be processed.

However, in the equipment for the latter method, the dopant elements adhere to the inner wall of the chamber and so it is necessary to clean the inner wall of the chamber frequently. Especially, where lightly doped n- or p-type regions should be formed by introducing a trace amount of impurity, the characteristics of the finished semiconductor device are affected materially by impurities of dissimilar conductivity types adhering to the inner wall of the chamber. Consequently, it has been necessary to clean the chamber frequently, in order to do quite light doping with high reproducibility.

The cleaning has been performed by wet-etching processing. For this reason, whenever the equipment is cleaned, the chamber is opened to atmosphere. It takes a very long time to evacuate the chamber up to a sufficiently high degree of vacuum. Since the equipment is a doping machine, if the constituents of the atmosphere adhere to the inner wall of the chamber, the constituents are mixed into the semiconductor during doping. Hence, it is necessary to completely degas the chamber. The produced problem is that the operating efficiency of the equipment deteriorates.

For these reasons, dry cleaning processes in which the chamber is not required to be opened to atmosphere are necessary. In the prior art dry cleaning processes, a plasma is generated inside a chamber and thus elements adhering to the inner wall are removed by sputtering or chemical reactions. The problem with these prior art processes is that the chamber cannot be cleaned sufficiently up to its corners, because of spread of the plasma and because the plasma can be generated only within a limited region inside the doping equipment.

FIG. 1 schematically shows an ordinary ion doping system. This system comprises a chamber 1 which is shown to be cylindrical although the chamber 1 can assume various forms. Pipes for supplying gases used for doping such as diborane ($B_2H_6$) and phosphine ($PH_3$) are connected to the chamber. The doping system is further equipped with means for evacuating the inside of the chamber. In use, it is common practice to dilute the diborane and phosphine with hydrogen or the like. The inside of the chamber is partitioned into three major regions: a plasma source, an ion acceleration region, and an ion bombardment region.

The plasma source, indicated by numeral 3, is mounted near the top of the chamber and acts to generate a plasma by RF discharge or other method. The produced ions are accelerated toward the ion acceleration region located under the plasma source. The accelerated ions are directed to a sample which is placed on a sample stage 2 within the ion bombardment region. Thus, the sample is doped with impurities.

The ion acceleration region contains a plurality of slit-like electrodes as shown. A voltage is applied across the electrodes to extract and accelerate the ions. The slit-like electrodes include electrodes 4 and 5 that serve to extract the ions under the control of a power supply 8. A high voltage is applied between the electrode 5 and another electrode 7 by another power supply 9. Ions are accelerated within this region. If necessary, a reverse voltage can be applied to a further electrode 6 by a power supply 10 to decelerate the ions.

As can be seen from the figure, in the ordinary ion doping system, the region for producing a plasma is confined to the plasma source 3. Therefore, it is totally impossible to diffuse the plasma onto the whole inner wall of the chamber. However, the system is designed so that dopant ions can reach the doping region. Furthermore, the flow of ions has only a small degree of directivity. Therefore, the possibility that the dopant ions adhere to the inner wall or electrodes which are located in the ion path is very high. When the adhering impurities are subjected to another doping step, the impurities are ejected by ions and again introduced into the sample.

Consequently, dry cleaning using a plasma produces only a temporary effect. It has been necessary to clean the equipment by wet etching periodically.

In view of the foregoing problems, the present invention has been made. It is an object of the present invention to provide a method of cleaning up the inside of the chamber of an ion doping system by dry cleaning, especially by dry cleaning of boron.

SUMMARY OF THE INVENTION

In the present invention, after a doping step is carried out, a halogen fluoride is introduced into the chamber of an ion doping system. In this way, impurities, especially boron, are etched away. Preferably, the used halogen fluoride is at least one of ClF, $ClF_3$, BrF, $BrF_3$, IF, and $IF_3$. Especially, ClF and $ClF_3$ exhibit strong fluorinating action. At room temperature, boron becomes $BF_3$ and is evaporated off. Chlorine and fluorine forming ClF and $ClF_3$ are easily removable elements and less adversely affect the characteristics of semiconductor devices.

In order to execute the present invention, the chamber of the ion doping system should be provided with means for introducing a gaseous halogen fluoride, as shown in FIG. 1. In use, the gaseous halogen fluoride is diluted with nitrogen, argon, or the like. If necessary, a device for removing the halogen fluoride is provided. Since the halogen fluoride shows strong fluorinating action, the inner wall of the chamber is preferably made from a material such as a quartz which is stable against the halogen fluoride. The chamber and the sample stage may be made from a material such as aluminum which reacts with the halogen fluoride to make a passive state on the surface.

A halogen fluoride exhibits quite strong fluorinating action and fluorinates boron to form a gas $BF_3$. If the temperature is elevated above 100° C., then the reactivity is enhanced. Our research has revealed that if a contaminant consisting of mixture of phosphorus or arsenic with boron exits, then the phosphorus and arsenic can be cleaned up, as well as boron. We have not yet confirmed the chemistry, but one possible cause is that phosphorus or arsenic is fluorinated and evaporated off.

In the present invention, no plasma is used and, therefore, the whole inside of the chamber can be uniformly cleaned. Furthermore, the invention can be practiced simply by introducing a halogen fluoride into the chamber. Therefore, the invention is quite straightforward. Of course, when an etching process is carried out, it is not necessary to open the chamber to atmosphere. For this reason, the chamber can be cleaned without decreasing the operating efficiency of the equipment. Preferably, whenever a doping step is executed, the chamber is cleaned.

For example, in fabricating CMOS circuits, an n-type impurity such as phosphorus or arsenic and a p-type impurity such as boron are required to be implanted. It may be possible to use separate machines for implanting these two types of impurities. However, it is more economical to use only one machine for the same purpose. This also enhances the efficiency of the equipment.

In this doping process, the n-type impurity is introduced into the whole surface. Then, the surface is masked with a photoresist or the like to selectively implant boron. Conversely, after boron is implanted selectively, the n-type impurity is implanted into the whole surface.

In this case, the region to be doped with boron is always doped with the n-type impurity. However, the region to be doped with the n-type impurity is not always doped with boron.

More specifically, when the n-type impurity is implanted, even if a trace amount of boron exists inside the chamber, then undesirable results arise. Conversely, if a trace amount of n-type impurity exists inside the chamber during doping of boron, then no problem occurs, because the region to be doped with boron has been implanted with a considerable amount of n-type impurity.

Accordingly, in this case, whenever doping of boron ends, the chamber should be cleaned. For example, after an n-type impurity and boron have been introduced into the first substrate, the inventive dry cleaning process is performed to remove the boron from the chamber. Subsequently, the n-type impurity and boron are lodged into the next substrate. Alternatively, after boron is introduced into the first substrate, the chamber is cleaned. Then, the n-type impurity is implanted into the first substrate, and boron is lodged into the next substrate.

In the present invention, it is assured that the boron in the inner wall of the chamber is etched away. Therefore, if the doping steps are carried out in the order described above, boron is no longer present when the n-type impurity is implanted. In contrast, when boron is implanted, the n-type impurity is present inside the chamber. However, the region to be doped with boron has been already implanted with a considerable amount of the n-type impurity and so the trace amount of n-type impurity existing inside the chamber can be neglected.

These means are especially effective in manufacturing devices having lightly doped n-type regions (e.g., LDD MOS transistors).

Noting that an organic substance such as photoresist can be fluorinated and evaporated by the use of a halogen fluoride, the application of the inventive method can be extended in the manner described below. A substrate is masked with a photoresist. Those portions of the photoresist which are to be doped with boron are exposed. Then, boron is implanted into the substrate through the use of an ion doping system. Thereafter, in order to clean the chamber of the ion doping system, a gaseous halogen fluoride is introduced into the chamber. The substrate already implanted with boron is left in the chamber. As a result, the mask of photoresist over the substrate can be removed simultaneously.

Then, the n-type impurity is implanted. It follows that the n-type impurity is implanted into the whole surface of the substrate. At this time, it is not necessary that the substrate be placed on a sample stage. If the doping system is capable of processing only one substrate in one operation, a plurality of substrates may be contained inside the chamber. For example, where 10 substrates are processed by the doping process, boron is implanted into the 10 substrates successively. Then, these substrates are stocked in another location inside the same chamber. Subsequently, the chamber is cleaned. At the same time, the mask of photoresist on the substrates is removed. Then, the n-type impurity may be again implanted into the substrates successively.

If this scheme is adopted, labor for taking out the substrates can be omitted. Furthermore, the removal of the photoresist and cleaning of the chamber of the ion doping system can be done simultaneously. Hence, the productivity is improved, which in turn improves the economy.

DETAILED DESCRIPTION OF THE PREFERRED EMBODIMENTS

EXAMPLE 1

The present example is illustrated in FIG. 2. The present example resides in CMOS circuits formed by TFTs (thin-film transistors). The left side of FIG. 2 shows an n-channel TFT in cross section, while the right side shows a p-channel TFT in cross section, illustrating the process sequence. First, a silicon oxide film 202 having a thickness of 200 to 2000 Å is formed as a buffer film on a substrate 201 made of Corning 1737 glass by sputtering or plasma-assisted CVD (PCVD). Then, an amorphous silicon film is deposited to a thickness of 300 to 1500 Å by LPCVD, PCVD, sputtering, or other method. The amorphous film is heat-treated at 550–650° C. for 4 to 48 hours in a nitrogen ambient or in a vacuum, thus crystallizing the amorphous film.

Figure 1:
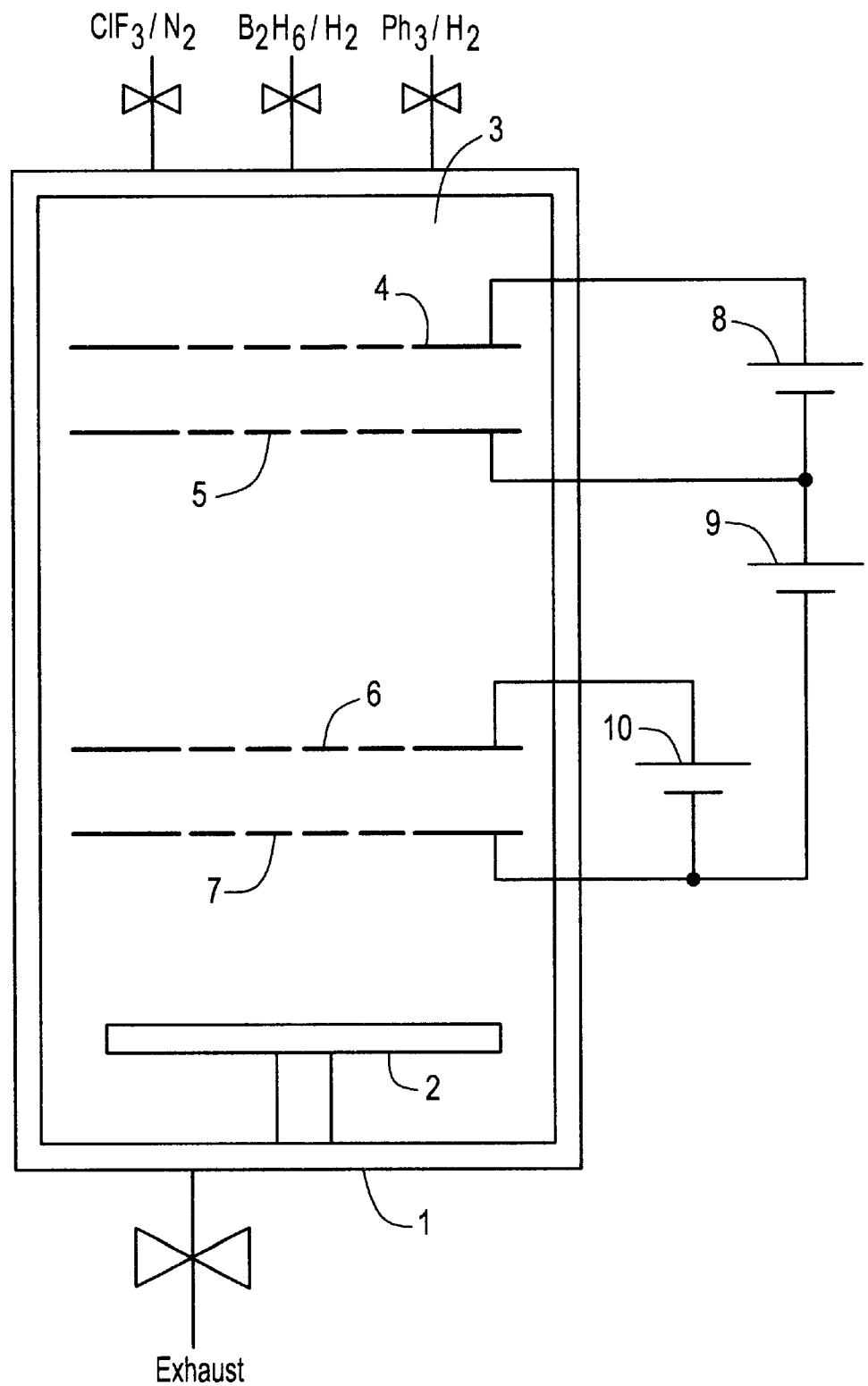
FIG. 1 is a schematic view of an ion doping system for use in the present invention.
Figure 2A:
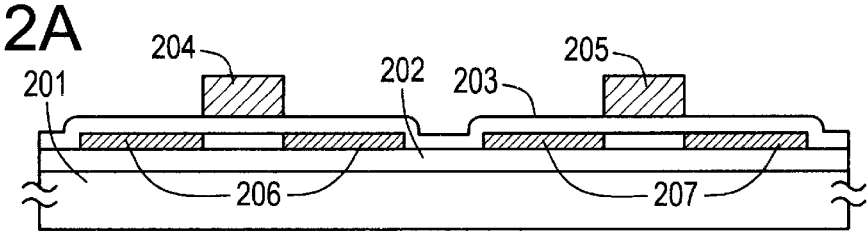
FIGS. 2(A) to 2(F) show cross-sectional views of TFTs, illustrating the process sequence of Example 1 of the present invention.
Figure 2B:
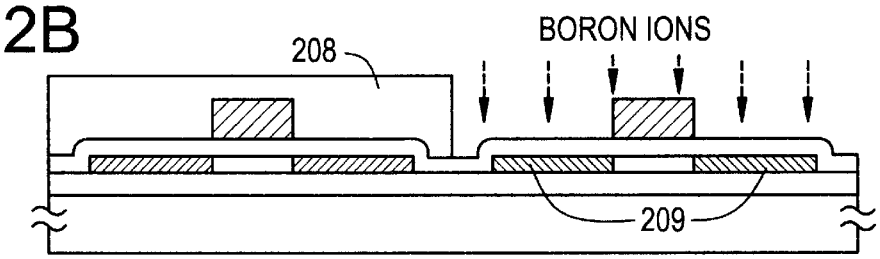
Figure 2C:
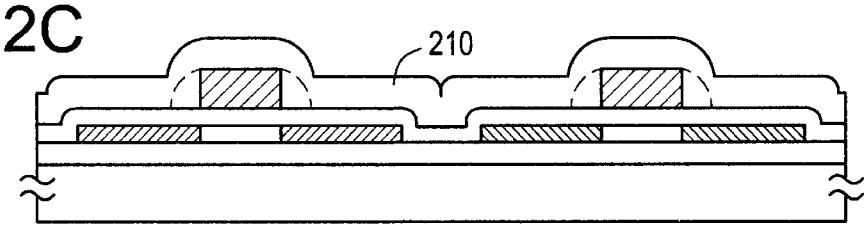
Figure 2D:
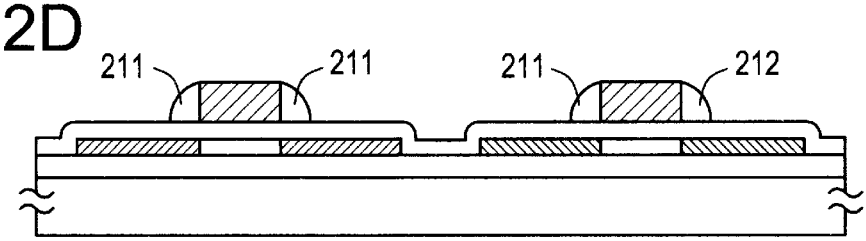
Figure 2E:
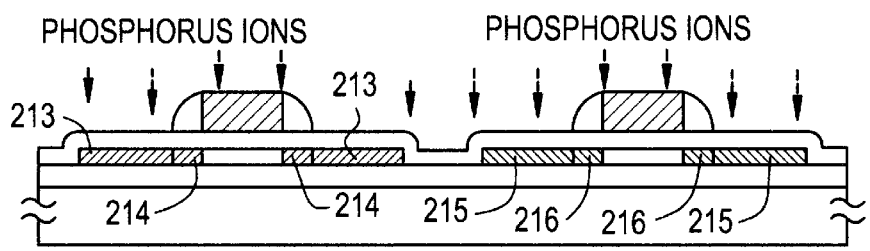
Figure 2F:
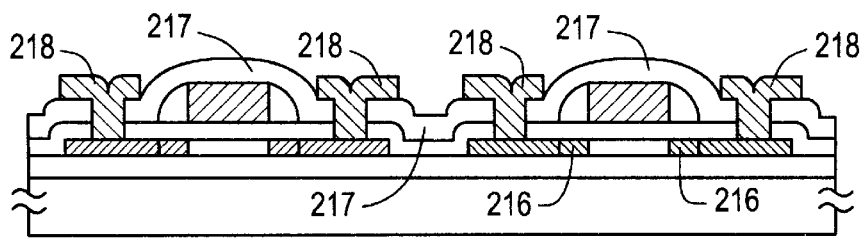

The crystallized silicon film is etched to form TFT regions (active layer). Then, a silicon oxide film 203 having a thickness of 500 to 1500 Å is deposited. This oxide film 203 acts as a gate oxide film. Gate electrodes 204 and 205 are formed out of a polysilicon film having a thickness of 5000 Å. Using the gate electrodes 204 and 205 as a mask, phosphorus ions are implanted to form lightly doped n-type regions 206 and 207. The ion doping system shown in FIG. 1 is used. The dose is $5 \times 10^{12}$ atoms/cm$^2$ (FIG. 2(A)).

Thereafter, the region of the n-channel TFT (to the left) is masked with photoresist 208. Under this condition, the laminate is heavily implanted with boron by the use of the ion doping system employed to form the lightly doped regions 206 and 207. The dose is $1 \times 10^{15}$ atoms/cm$^2$. The accelerating voltage is 65 kV. As a result, the doped region 207 which has been doped weak n-type by the aforementioned introduction of phosphorus is inverted into strong p-type, thus forming a p-type doped region 209 (FIG. 2(B)).

After taking the substrates from the ion doping system, mixture gas of ClF$_3$ and nitrogen is fed into the chamber of the ion doping system. In the present example, the pressure inside the chamber is 5 torr. The temperature is 25° C. The flow rate of the ClF$_3$ is 200 sccm. The flow rate of nitrogen is 100 sccm. In the present example, ClF$_3$ is supplied for a given time. Then, the supply is stopped, and the chamber is purged with nitrogen. Thus, the chamber of the doping system is cleaned.

During this process, the mask 208 of photoresist formed on the substrate is peeled off. A silicon oxide film 210 having a thickness of 4000 to 8000 Å is deposited by PCVD. The optimum value of the thickness of the silicon oxide film 210 differs according to the height of gate electrodes/interconnects, 204 and 205. For example, where the height of the gate electrodes/interconnects is 5000 Å as in the present example, the thickness of the silicon oxide film 210 is preferably ½ to 2 times the height, i.e., 2500 Å to 1 μm. In the present example, the thickness of the silicon oxide film 210 is 5000 Å. In this film formation step, the film thickness is required to be uniform in the planar portions. In addition, good step coverage is necessitated. As a result, the thickness of the silicon oxide film 210 at the side surfaces of the gate electrodes/interconnects is increased by the amount indicated by the broken lines in FIG. 2(C).

Then, an anisotropic dry etching step is carried out, using a well-known RIE method, to etch the silicon oxide film 210. This step ends when the etching reaches the interface with the gate-insulating film 203. The endpoint of the etching can be controlled by making the etch rate of the gate-insulating film 203 smaller than that of the silicon oxide film 210. Consequently, substantially triangular insulator portions 211 and 212 are left on the side surfaces (sidewalls) of the gate electrodes/interconnects, 204 and 205 (FIG. 2(D)).

Then, phosphorus ions are again introduced by ion implantation. At this time, the doping system has completed the cleaning according to the present invention. The dose is preferably larger than the dose used in the step illustrated in FIG. 2(A) by 1–3 orders of magnitude and ¹⁄₁₀ to ²⁄₃ times the dose used in the step illustrated in FIG. 2(B). In the present example, the dose is 100 times as large as the dose of the initially introduced phosphorus, i.e., $5 \times 10^{14}$ atoms/cm$^2$, which is, however, half the dose of the boron introduced in the step illustrated in FIG. 2(B). The accelerating voltage is 80 kV. As a result, regions (source/drain regions) 213 heavily doped with phosphorus are formed. Furthermore, lightly doped regions (LDD regions) 214 are left under the sidewalls.

The p-channel TFT region (to the right of the figure) is also doped with phosphorus. However, the concentration of previously implanted boron is twice as high as the concentration of phosphorus and so this region remains p-type. Apparently, two kinds of p-type regions exist in the p-channel TFT, i.e., a region 216 under the sidewall and an outer region 215 located on the opposite side of the channel formation region. However, they differ only a little in electrical characteristics (FIG. 2(E)).

After the end of the doping step, the laminate is thermally annealed at a temperature of 600° C., thereby activating the impurities. A silicon oxide film is formed as an interlayer dielectric 217 having a thickness of 3000 Å over the whole surface by CVD. Contact holes are created in the source/drain regions of the TFTs. Then, aluminum interconnects/electrodes 218 are formed. Thus, CMOS circuits consisting of n-channel and p-channel TFTs are completed (FIG. 2(F)).

In the present example, sidewalls 211 and 212 are formed on the gate electrodes/interconnects 204 and 205, respectively, thus forming LDD (lightly doped drain) regions 214. This mitigates deterioration caused by hot-carrier injection into the n-channel TFT. However, each LDD region is a parasitic resistor inserted in series between the source and drain and thus lowers the operating speed. Accordingly, the p-channel TFT which has a small mobility and is less likely to be deteriorated by hot carriers preferably has no LDD region as in the present example.

The presence of the sidewalls 211 and 212 mitigates the steepness of the step even at the portions where the second layer of metallization intersects the gate interconnects. Almost no breaks are found in the interconnects.

EXAMPLE 2

The present example is described by referring to FIG. 3. Also in the present example, CMOS circuits are constructed, using TFTs. First, an oxide film 302 having a thickness of 2000 Å is formed as a buffer film on a substrate 301 made of Corning 7059 glass. Then, an amorphous or crystalline silicon film is formed to a thickness of 300 to 1500 Å, preferably 500 to 1000 Å, by PCVD or LPCVD. To obtain the crystalline silicon film, after forming an amorphous silicon film, it is irradiated with laser radiation (photo-annealing) or equivalent intense light or thermally annealed at a temperature higher than 500° C. for a long time.

After crystallizing the amorphous silicon film by thermal annealing, the crystallinity may be enhanced further by photo-annealing. During crystallization utilizing thermal annealing, a catalytic element such as nickel for promoting the crystallization may be added, as described in Japanese Patent Laid-Open Nos. 244103/1994 and 244104/1994.

Then, the silicon film is etched to form a region 303 for an n-channel TFT and a region 304 for a p-channel TFT. A gate-insulating film 305 is formed out of silicon oxide to a thickness of 500 to 2000 Å by sputtering in an oxygen ambient. The method of forming the gate-insulating film can be plasma-assisted CVD.

In the present invention, the gate-insulating film 305 preferably has a sufficiently high withstand voltage, because a strong electric field is applied between the gate electrode and the activated silicon layer during an anodization step carried out later. Accordingly, where the gate-insulating film is formed out of a silicon oxide film obtained by PCVD, it is desired to use nitrous oxide (nitrogen monoxide) (N$_2$O)

and monosilane (SiH$_4$) as gaseous raw materials. Alternatively, oxygen (O$_2$) and monosilane may be used as gaseous raw materials.

Subsequently, an aluminum film containing 0.1 to 0.5% by weight of scandium is formed to a thickness of 2000 Å to 5 μm, preferably 2000 to 6000 Å, over the whole surface of the substrate by sputtering techniques. The surface of the aluminum film is anodized to form an aluminum oxide film (not shown) having a thickness of 100 to 300 Å. The presence of the aluminum oxide film improves the adhesion to the photoresist and suppresses leakage current from the photoresist. This is effective in forming porous anodic oxides only on the sidewalls in an anodization step conducted later.

A layer of a photoresist such as OFPR800/30 cp produced by Tokyo Ohka Kogyo Co., Ltd. is formed by spin coating. This photoresist layer is patterned and etched to form gate electrodes 308 and 309, using masks 306 and 307 of the photoresist. These masks 306 and 307 are left as they are (FIG. 3(A)).

Then, an electrical current is passed through only the gate electrode 308 for the n-channel TFT while the photoresist masks 306 and 307 are left on the electrode, thus carrying out the anodization step. In this way, a porous anodic oxide 310 is formed on the side surface of the gate electrode 308. The anodization is effected, using a 3–20% acidic aqueous solution such as citric acid, nitric acid, phosphoric acid, chromic acid, or sulfuric acid. A constant current of 10 to 30 V is applied to the gate electrode. In the present example, a solution of oxalic acid (30° C.) with pH=0.9 to 1.0 is used. The voltage is set to 10 V. The anodization is carried out for 20 to 80 minutes. The thickness of the anodic oxide is controlled by the anodization time. If the anodization is effected within such an acidic solution, a porous anodic oxide forms. In the present example, the thickness of the porous anodic oxide 310 is 3,000 to 10,000 Å, e.g., 5000 Å.

Figure 3A:
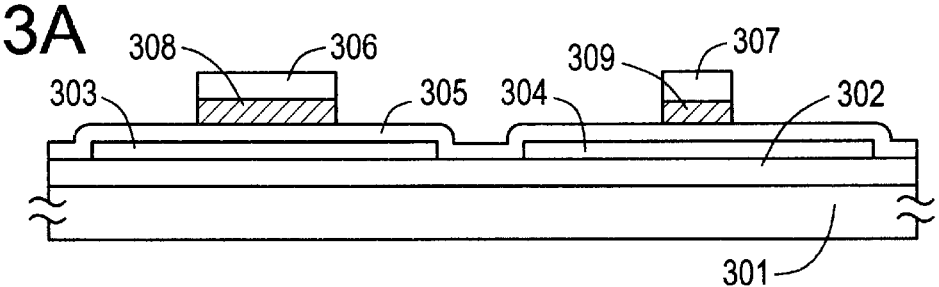
FIGS. 3(A) to 3(F) show cross-sectional views of TFTs, illustrating the process sequence of Example 2 of the present invention.
Figure 3B:
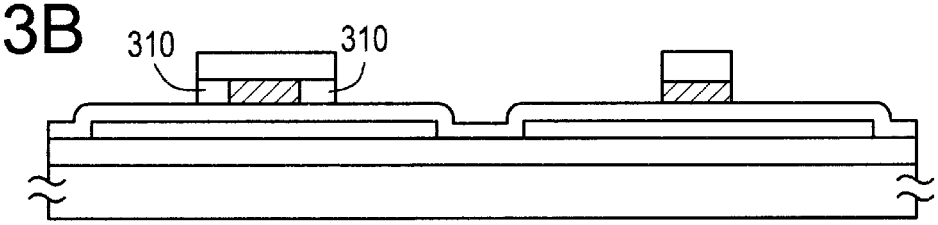
Figure 3C:
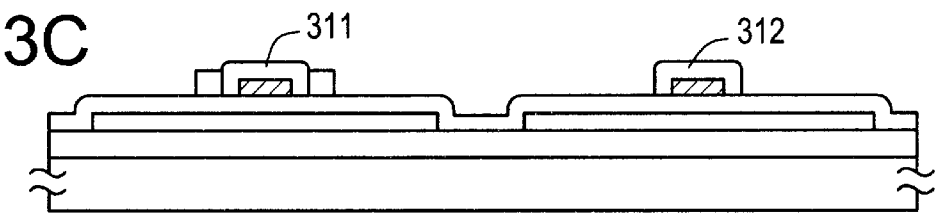
Figure 3D:
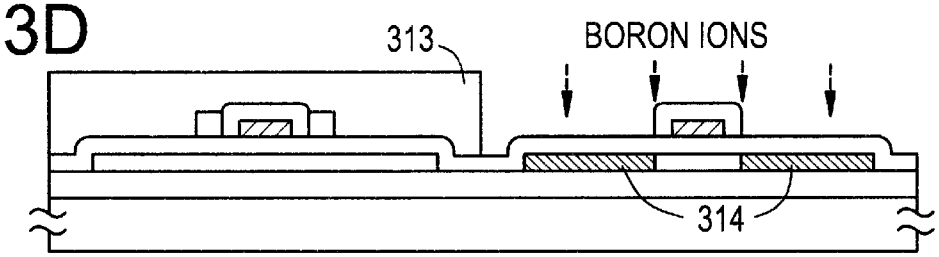

On the other hand, with respect to the gate electrode 309 for the p-channel TFT, no current is supplied to this electrode, and no anodic oxide is formed on it (FIG. 3(B)).

Thereafter, the photoresist masks 308 and 309 are peeled off. The laminate is immersed in an ammonium solution of tartaric acid (pH=6.9 to 7.1). An electrical current is passed through the gate electrodes 308 and 309 to conduct a barrier-type anodization step under the conditions described in Japanese Patent Laid-Open No. 267667/1993. As a result, a dense, barrier-type anodic oxide films 311 and 312 having a thickness of 1200 Å are formed on the side and top surfaces of the gate electrodes 308 and 309 (FIG. 3(C)).

In this way, the anodic oxide formed by the anodization conducted within a substantially neutral solution is dense, hard, and shows a high breakdown voltage. The breakdown voltage is more than 70% of the maximum voltage applied during the anodization. This kind of anodic oxide is known as barrier-type anodic oxide.

The region forming the n-channel TFT is coated with a photoresist mask 313. Boron ions are introduced into the laminate by an ion doping method. The accelerating voltage is 65 kV. The dose is 1×10$^{15}$ atoms/cm$^2$ (FIG. 3(D)).

After the doping step, the laminate is left in the chamber of the doping system. Under this condition, ClF$_3$ is supplied into the chamber at 1 torr. The flow rate of the ClF$_3$ is 500 sccm. The laminate is heated to 100° C. In this way, the photoresist mask 313 is ashed. Since the laminate is heated, vigorous reactions take place. The ashing time is only one-third to one-fifth the ashing time necessary under room-temperature conditions. At the same time, boron adhering to the inner wall of the chamber of the doping system can be removed.

Then, the laminate is taken out of the doping system and transported to a dry etching system. Using the barrier-type anodic oxides 311, 312 and the porous anodic oxide 310 around the gate electrodes as a mask, the silicon oxide film 305 is etched by dry etching techniques. The silicon oxide film 305 under the porous anodic oxide 310 is not etched and left behind.

Thereafter, only the porous anodic oxide 310 is etched, using mixture solution of phosphoric, acetic, and nitric acids (aluminum mixed acid). The aluminum mixed acid etches aluminum and porous anodic oxides but hardly attacks the barrier-type anodic oxides 311 and 312. In the present example, the surroundings of the gate electrodes 308 and 309 are coated with the barrier-type anodic oxides 311 and 312 and so the gate electrodes 308 and 309 are not varied at all in this manufacturing step.

The laminate is returned to the ion doping system, where phosphorus is introduced into the silicon region 303 of the n-channel TFT. The employed doping process consists of two steps. First, phosphorus ions are implanted at a relatively high dose of 5×10$^{14}$ atoms/cm$^2$ and at a relatively low accelerating voltage of 10 to 30 keV. Since the accelerating voltage is low, the ion implantation depth is small, and the phosphorus ions are implanted around the exposed silicon region 315. At this time, the phosphorus ions are also implanted into the p-type region 314 but this region 314 remains p-type, because the amount of boron already implanted is sufficient to cancel the effect of the implanted phosphorus ions.

Then, phosphorus ions are implanted at a relatively high accelerating voltage of 60 to 95 keV and at a relatively low dose of 1×10$^{12}$ to 1×10$^{14}$ atoms/cm$^2$. Since the accelerating voltage is high, the phosphorus ions penetrate deep into the silicon region and even into the region 316 coated with the gate-insulating film.

Figure 3E:
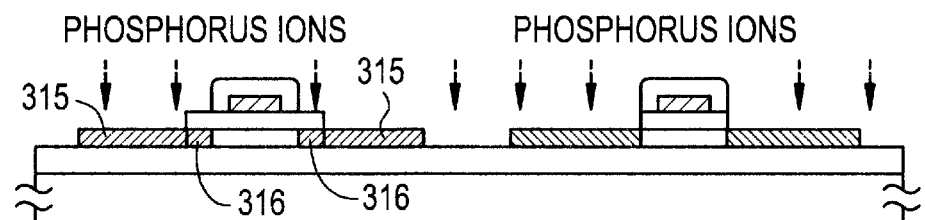
Figure 3F:
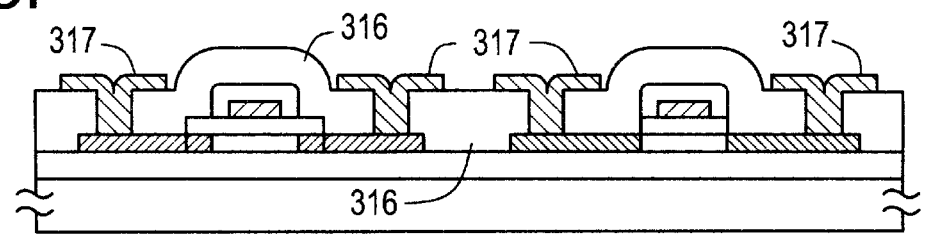

As a result, the region 315 heavily doped with phosphorus and the LDD region 316 lightly doped with phosphorus are formed (FIG. 3(E)).

The implanted impurities are activated by a KrF excimer laser emitting laser radiation having a wavelength of 248 nm and a pulse width of 20 nsec. The energy density of the laser radiation is 200 to 400 mJ/cm$^2$, preferably 250 to 300 mJ/cm$^2$. In consequence, the n- and p-type regions are activated. The n-type region 315 and the p-type region 314 have sheet resistances of 200 to 800Ω/.

Thereafter, a silicon oxide film is formed as an interlayer dielectric 316 over the whole surface to a thickness of 3000 to 6000 Å by PCVD. This silicon oxide film may be replaced by a silicon nitride film or a multilayer film of a silicon oxide film and a silicon nitride film. Contact holes are formed in the interlayer dielectric 316, followed by formation of titanium electrodes/interconnects 317 (FIG. 3(F)).

The present invention makes it possible to quite easily clean an ion doping system used for manufacture of semiconductor integrated circuits. Therefore, finished semiconductor devices are less contaminated by dissimilar elements. Semiconductor devices having favorable characteristics can be manufactured with high yield. The present invention yields the advantages as described above. In the illustrated examples, the description centers around TFTs. Obviously, the invention can also be applied with equal utility to normal semiconductor integrated circuits. In this way, the present invention is industrially advantageous.

What is claimed is:

1. A method of cleaning an ion doping system for implanting boron into a semiconductor, said method comprising the step of:

feeding a gas containing a halogen fluoride into a chamber mounted in said doping system, thus removing boron adhering to a wall inside said chamber.

2. The method of claim 1 wherein said halogen fluoride is at least one of ClF, ClF$_3$, BrF, BrF$_3$, IF, and IF$_3$.

3. The method of claim 1 wherein said plasma having boron is obtained by discharging a gas having diborane.

4. The method of claim 1 wherein said gas containing a halogen fluoride is fed into said chamber with said gas being diluted with nitrogen or argon.

5. The method of claim 1 wherein said gas containing a halogen fluoride is kept at a temperature of 100° C. or higher.

6. The method of claim 1 wherein said removing boron is performed without using a plasma.

7. A method of cleaning an ion doping system for implanting boron into a semiconductor, said method comprising the steps of:

forming a photoresist mask on a semiconductor;

doping a boron to said semiconductor through said photoresist mask by ion doping device; and introducing a gas containing a halogen fluoride into said ion doping device to carry out cleaning of said ion doping device and to remove said photoresist mask.

8. The method of claim 7 wherein said halogen fluoride is at least one of ClF, ClF$_3$, BrF, BrF$_3$, IF, and IF$_3$.

9. The method of claim 7 wherein said boron is implanted into said semiconductor by producing an electric discharge to generate a plasma having boron and then accelerating said plasma at a high voltage, said plasma having boron being obtained by discharging a gas having diborane.

10. The method of claim 7 wherein said gas containing a halogen fluoride is kept at a temperature of 100° C. or higher.

11. The method of claim 6 wherein said cleaning is performed without using a plasma.

12. A method comprising the steps of:

doping boron into a semiconductor film comprising silicon in a chamber mounted in an ion doping system;

introducing a gas comprising a halogen fluoride into said chamber in order to carry out cleaning of said chamber, after said doping; and stopping said introducing, wherein said halogen fluoride is at least one of ClF, ClF$_3$, BrF, BrF$_3$, IF and IF$_3$.

13. The method of claim 12, wherein said gas further comprises one of nitrogen and argon.

14. The method of claim 12, said method including forming a thin film transistor comprising said semiconductor film.

15. The method of claim 12, said method including forming a semiconductor integrated circuit.

16. A method comprising the steps of:

forming a semiconductor film comprising silicon over a substrate;

etching said semiconductor film to form at least two regions of said semiconductor film;

forming a photoresist mask over one of said two regions;

doping boron into the other one of said two regions in a chamber mounted in an ion doping system;

introducing a gas comprising a halogen fluoride into said chamber in order to carry out cleaning of said chamber and to remove said photoresist mask, after said doping; and stopping said introducing, wherein said halogen fluoride is at least one of ClF, ClF$_3$, BrF, BrF$_3$, IF and IF$_3$.

17. The method of claim 16 wherein said gas further comprises one of nitrogen and argon.

18. The method of claim 16, said method including forming a CMOS circuit comprising an N-channel thin film transistor and a P-channel thin film transistor, wherein said N-channel thin film transistor and said P-channel thin film transistor are formed by using said two regions.

19. The method of claim 16, said method including forming a semiconductor integrated circuit.

* * * * *